US009576650B2

(12) United States Patent
Sebastian et al.

(10) Patent No.: US 9,576,650 B2
(45) Date of Patent: *Feb. 21, 2017

(54) READ MEASUREMENT OF A PLURALITY OF RESISTIVE MEMORY CELLS FOR ALLEVIATING RESISTANCE AND CURRENT DRIFT

(71) Applicant: International Business Machines Corporation, Armonk, NY (US)

(72) Inventors: Abu Sebastian, Adliswil (CH); Nikolaos Papandreou, Thalwil (CH); Charalampos Pozidis, Thalwil (CH)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 159 days.

This patent is subject to a terminal disclaimer.

(21) Appl. No.: 14/164,725

(22) Filed: Jan. 27, 2014

(65) Prior Publication Data
US 2014/0211541 A1    Jul. 31, 2014

(30) Foreign Application Priority Data
Jan. 30, 2013 (GB) .................................. 1301622.5

(51) Int. Cl.
G11C 13/00 (2006.01)
G11C 11/56 (2006.01)

(52) U.S. Cl.
CPC ......... *G11C 13/004* (2013.01); *G11C 11/5685* (2013.01); *G11C 13/0002* (2013.01); *G11C 13/0061* (2013.01); *G11C 2013/0057* (2013.01)

(58) Field of Classification Search
CPC ............ G11C 11/5614; G11C 11/5678; G11C 11/5685; G11C 11/5642; G11C 13/0004; G11C 13/0007; G11C 13/0011; G11C 13/0035; G11C 13/004
See application file for complete search history.

(56) References Cited

U.S. PATENT DOCUMENTS

| 6,914,801 | B2 | 7/2005 | Kostylev et al. |
| 7,570,507 | B2 | 8/2009 | Nirschl |
| 7,796,424 | B2 | 9/2010 | Happ et al. |
| 7,830,705 | B2 | 11/2010 | Jeong et al. |

(Continued)

OTHER PUBLICATIONS

Ielmini et al; Recovery and drift dynamics of resistance and threshold voltages in phase-change memories, 308-315, IEEE Transactions on Electron Devices, vol. 54, No. 2, Feb. 2007.

(Continued)

*Primary Examiner* — Andrew Q Tran
(74) *Attorney, Agent, or Firm* — Garg Law Firm, PLLC; Rakesh Garg; William J. Stock

(57) ABSTRACT

A method for read measurement of a plurality N of resistive memory cells having a plurality M of programmable levels is suggested. The method includes a step of reading back from a number of reference cells to obtain a reading back parameter, a step of determining an actual read voltage for the N memory cells based on the obtained reading back parameter for obtaining a target read current at a following read measurement, and, a step of applying the determined actual read voltage to the N memory cells at the following read measurement.

13 Claims, 14 Drawing Sheets

(56) References Cited

U.S. PATENT DOCUMENTS

| | | | |
|---|---|---|---|
| 7,929,338 B2 * | 4/2011 | Franceschini | G11C 11/56 365/148 |
| 8,040,723 B2 | 10/2011 | Sheu et al. | |
| 8,199,567 B2 | 6/2012 | Chang-Wook et al. | |
| 8,737,121 B2 * | 5/2014 | Lam | H01L 45/06 365/158 |
| 9,190,171 B2 * | 11/2015 | Papandreou | G11C 29/021 |
| 2009/0303785 A1 | 12/2009 | Hwang et al. | |

OTHER PUBLICATIONS

Helme ‡ : A resistance drift resilient architecture for multi-level cell phase change memory system.

Awasthi, Handling PCM resistance drift with device, circuit, architecture, and system solutions.

H.-S. P. Wong et al., Phase ChangeMemory, vol. 98, 0018-9219/ $26.00 2201-2227, 2010 IEEE No. 12, Dec. 2010, Proceedings of the IEEE, 2010.

H.-S. P. Wong et al., Metal-Oxide RRAM, vol. 0018-9219/$31.00, 2012 IEEE 100, No. 6, Jun. 2012, Proceedings of the IEEE, 1951-1970, 2012.

M. Boniardi et al., A physics-based model of electrical conduction decrease with time in amorphous Ge2Sb2Te5, Journal of Applied Physics 105, 084506, 2009.

N. Papandreou et al., Drift-Resilient Cell-State Metric for Multi-level Phase-Change Memory, Proceedings of the IEEE International Memory Workshop, 2011.

A. Sebastian et al., Non-resistance-based cell-state metric for phase-change memory, Journal of Applied Physics 110, 084505, 2011.

N. Papandreou et al., Drift-Tolerant Multilevel Phase-Change Memory, IEDM Tech. Digest, 2011.

* cited by examiner (PRIOR-ART)

(PRIOR-ART)

(PRIOR-ART)

(PRIOR-ART)

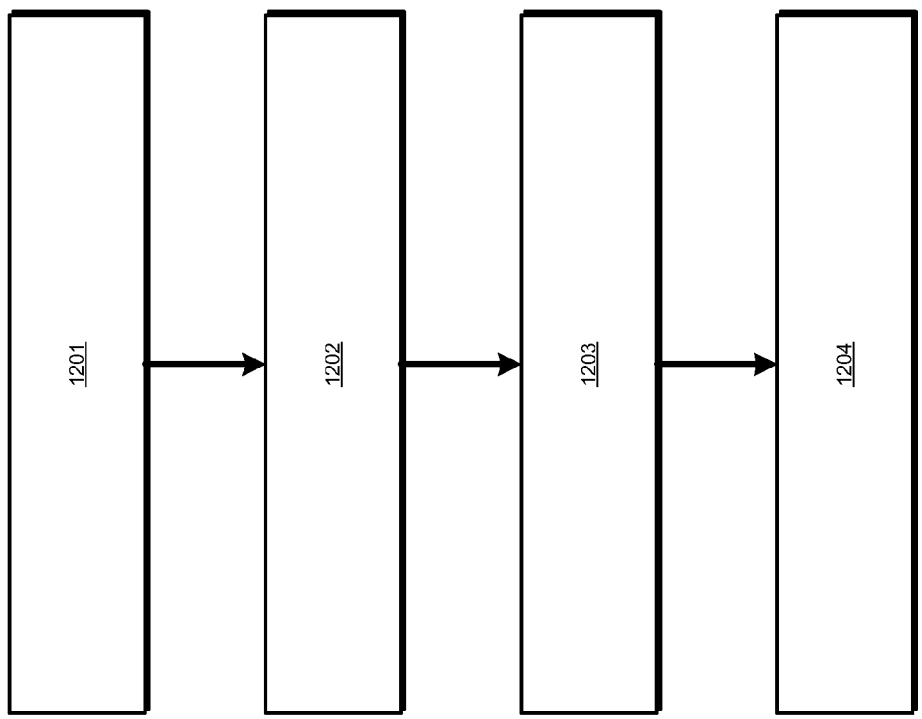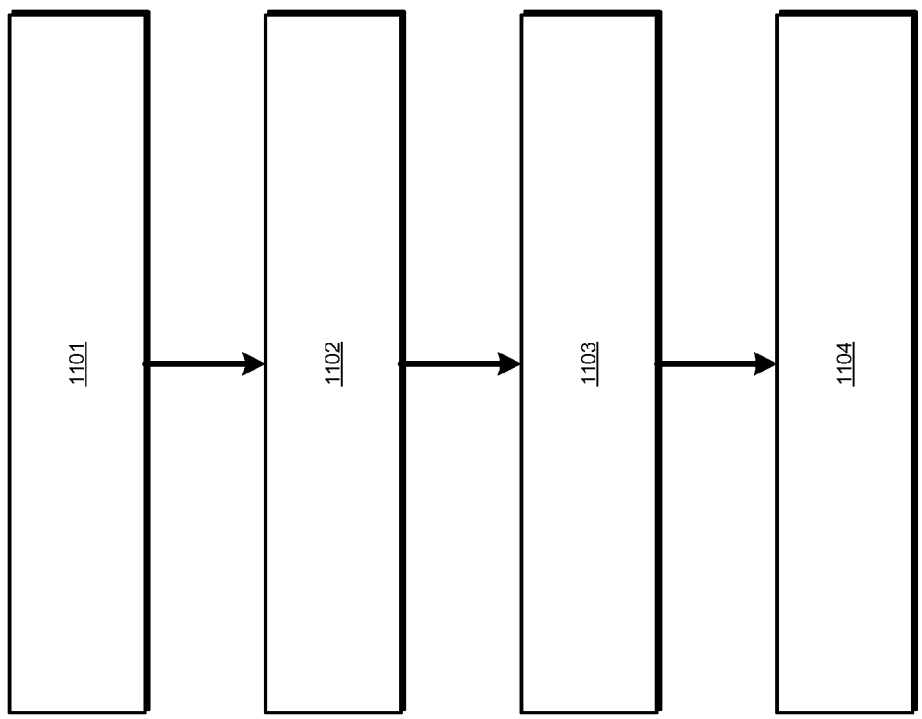

READ MEASUREMENT OF A PLURALITY OF RESISTIVE MEMORY CELLS FOR ALLEVIATING RESISTANCE AND CURRENT DRIFT

BACKGROUND

Technical Field

The invention relates to a method and to an apparatus for read measurement of a plurality of resistive memory cells having a plurality of programmable levels.

Description of the Related Art

A prominent example for resistive memory cells having a plurality of programmable levels is Resistive Random Access Memory (RRAM), particular Phase Change Memory (PCM). PCM is a non-volatile solid-state memory technology that exploits the reversible, thermally-assisted switching of specific chalcogenides between certain states of different electrical conductivity.

PCM is a promising and advanced emerging non-volatile memory technology mainly due to its excellent features including low latency, high endurance, long retention and high scalability. PCM may be considered a prime candidate for Flash replacement, embedded/hybrid memory and storage-class memory. Key requirements for competitiveness of PCM technology may be multi-level cell functionality, in particular for low cost per bit, and high-speed read/write operations, in particular for high bandwidth. Multilevel functionality, i.e. multiple bits per PCM cell, may be a way to increase storage capacity and thereby to reduce cost.

Multi-level PCM is based on storing multiple resistance levels between a lowest (SET) and a highest (RESET) resistance value. Multiple resistance levels or levels correspond to partial-amorphous and partial-crystalline phase distributions of the PCM cell. Phase transformation, i.e. memory programming, may be enabled by Joule heating. In this regard, Joule heating may be controlled by a programming current or voltage pulse. Storing multiple resistance levels in a PCM cell is a challenging task.

For example, one reference describes that the multiple states or levels in a PCM cell are created by varying the programming power, thus creating different crystalline and amorphous fractions within the cell. Further according to another reference, in metal-oxide resistive memory devices, multiple states may correspond to variations in the gap between conductive oxygen-vacancy filaments and the electrodes.

However, in many of such devices, temporal drift may pose a significant challenge to the realization of reliable multi-level functionality. The current-voltage characteristics associated with the various programmed levels exhibit temporal changes. This is usually attributed to the deviations in the band-gap and/or defect density of the memory materials over time. Low-field resistance that is widely used to differentiate between the various programmed states is particularly susceptible to drift.

In this regard, FIGS. 1 to 4 show an example illustrating drift in PCM cell having four levels (states). In this regard, FIG. 1 shows a read voltage 101 which is constant over time. FIG. 2 illustrates the resistance drift 201-204 of the four levels. The current drift is inverse to the resistance drift and shown by corresponding graphs 301-303 of FIG. 3. Further, FIG. 4 shows the drift coefficient for the resistance (curve 401) and for the current (curve 402). Recapitulating FIGS. 1 to 4, the low-field electrical resistance is particularly sensitive to the variation in activation energy applied by the current. When the cells are read with a constant read voltage, both the resistance R and the current I will drift with a drift coefficient having the same magnitude, but opposite polarity (see FIG. 4).

To counter drift, several techniques are known. One of the known techniques is the use of reference cells programmed to multiple resistance levels. These references may be programmed together with the programming of regular data cells or memory cells. By monitoring and characterizing the drift behaviour of each of the programmed levels, the drift in the regular memory cells may be partially accounted for, for example by altering the threshold levels for detection.

Another known technique is the use of so-called non-resistance-based cell-state-metrics as in the case of PCM cells (it is shown that the sub-threshold slope of the current-voltage curve corresponding to each programmed level is indicative of the amorphous/crystalline ratio and is not susceptible to drift. Several read-out schemes for estimating the slope are known.

In one reference, several coding strategies are proposed to address drift.

Accordingly, it is an aspect of the present invention to improve the read measurement of a plurality of resistive memory cells.

SUMMARY

According to an embodiment of a first aspect, a method for read measurement of a plurality N of resistive memory cells having a plurality M of programmable levels is suggested. The method includes a step of reading back from a number of reference cells to obtain a reading back parameter, a step of determining an actual read voltage for the N memory cells based on the obtained reading back parameter for obtaining a target read current at a following read measurement, and, a step of applying the determined actual read voltage to the N memory cells at the following read measurement.

According to embodiments of the invention, drift can be compensated by using said actual read voltage for reading out the memory cells. Said reading back parameter is indicative for the drift of the reference cells and therefore for the identical memory cells. By means of said reading back parameter, said actual read voltage is determined such that a certain target read current may be obtained at the following read measurement. Thus, any drift may be compensated for by adjusting the actual read voltage in dependence on said reading back parameter. Over time, said actual read voltage may be understood as a variable read voltage which may be used instead of a conventional constant read voltage. In particular, due to the exponential dependence of current on voltage, minor changes in the read voltage are sufficient to compensate for drift over a significant period of time. Moreover, by changing the read voltage, namely always using the respective determined actual read voltage, one may also counter further effects from variations in ambient temperature and the like.

According to some implementations, the resistive memory cell is a PCM cell (PCM, Phase Change Memory). The PCM cell may be understood as a non-linear resistive device. In particular, the memory cells and/or the reference cells form a memory array.

In an embodiment, for a plurality of consecutive read measurements, the actual read voltage is determined for a respective one of the plurality of consecutive read measurements such that the target read current is constant over time. A constant read current over time corresponds to an optimal track of drift.

In a further embodiment, the reference cells are programmed to an intermediate level of the M programmable levels. Programming the reference cells with the intermediate level corresponds to an optimum of the reference for the memory cells for obtaining the respective actual read voltage.

In a further embodiment, the method includes the following steps:
- applying a reference read voltage to the number of reference cells and obtaining a reference read current due to the applied reference read voltage,
- determining a drift tracking parameter based on the obtained reference read current, wherein the drift tracking parameter indicates a drift of the reference cells,
- determining the actual read voltage for the N memory cells based on the reference read voltage and the determined drift tracking parameter for obtaining the target read current at the following read measurement, and
- at the following read measurement, applying the determined actual read voltage to the N memory cells.

In this embodiment, a small fraction of the cells is used as reference cells. The reference cells may be programmed to an intermediate resistance level together with the memory cells. At any point in time prior to reading from said memory cells, based on the measured reference read current from the reference cells, the parameter called drift tracking parameter is determined, in particular calculated. Based on the calculated drift tracking parameter, the actual read voltage is evaluated. This actual read voltage is then used to read all the memory cells. As an alternative, the drift tracking parameter may be estimated based on the memory cells themselves.

In a further embodiment, the drift tracking parameter is estimated based on the obtained reference read current.

In a further embodiment, the method includes the following steps:
- at a first instance of time, applying the reference read voltage to the reference cells programmed to an intermediate level of the M levels,
- determining the drift tracking parameter based on the obtained reference read current,
- at a second instance of time, determining the actual read voltage for the N memory cells based on the reference read voltage and the determined drift tracking parameter adjusted for the second instance of time, and
- at the second instance of time, applying the determined actual read voltage to the N memory cells.

In a further embodiment, the method includes the following steps:
- specifying a certain constant read current for a number of reference cells,
- determining a reference read voltage for the reference cells such that the read current due to the applied reference read voltage corresponds to the certain constant read current,
- determining the actual read voltage for the N memory cells based on the determined reference read voltage for obtaining the target read current at the following read measurement, and
- at the following read measurement, applying the determined actual read voltage to the N memory cells.

In particular, the reference read voltage is modified such that the read current due to the applied reference read voltage corresponds to the certain constant read current.

In the above-mentioned embodiment, some reference cells are programmed to an intermediate resistance level together with the memory cells. At any point of time, the read voltage that maintains said certain constant read current in the reference cells is obtained using an iterative read procedure, for example. Once this read voltage is obtained, it is used as said actual read voltage for reading all the memory cells.

In a further embodiment, the actual read voltage corresponds to the determined reference read voltage.

In a further embodiment, the reference read voltage is modified using a feedback controller. The feedback controller may be embodied by an integral feedback controller or by a signed-error feedback controller, for example.

In a further embodiment, the feedback controller is adapted to modify the reference read voltage such that a current error between the read current due to the applied reference read voltage and the certain constant read current is minimized. In particular, the current error is a zero current error.

The feedback controller is configured to provide an iterative read scheme. The read voltage output from the feedback controller may be used to read the memory cells directly. Advantageously, the feedback controller accounts for variations due to drift and other unmodeled effects such as temperature variations and the like.

In a further embodiment, the certain constant read current corresponds to the target read current.

Any embodiment of the first aspect may be combined with any embodiment of the first aspect to obtain another embodiment of the first aspect.

According to an embodiment of a second aspect, the invention relates to a computer program comprising a program code for executing at least one step of the method of the first aspect for read measurement of a plurality N of resistive memory cells having a plurality M of programmable levels when run on at least one computer.

According to an embodiment of a third aspect, an apparatus for read measurement of a plurality N of resistive memory cells having a plurality M of programmable levels is suggested. The apparatus comprises a voltage generator for applying a voltage to a cell, a measurement circuit for making a measurement indicative of cell current, and a controller for controlling operation of the apparatus. The measurement circuit is configured to read back from a number of reference cells to obtain a reading back parameter. The controller is configured to determine an actual read voltage for the N memory cells based on the obtained reading back parameter for obtaining a target read current at a following read measurement. Further, the voltage generator is configured to apply the determined actual read voltage to the N memory cells at the following read measurement.

According to an embodiment of a fourth aspect, a resistive memory device is suggested which comprises a memory including a plurality N of resistive memory cells having a plurality M of programmable levels, and a read/write apparatus for reading and writing data in the resistive memory cells, wherein the read/write apparatus includes an apparatus of above mentioned third aspect.

In the following, exemplary embodiments of the present invention are described with reference to the enclosed figures.

BRIEF DESCRIPTION OF THE DRAWINGS

FIG. 11 shows a second embodiment of a sequence of method steps for read measurement of a plurality of resistive memory cells having a plurality of programmable levels;

FIG. 12 shows a third embodiment of a sequence of method steps for read measurement of a plurality of resistive memory cells having a plurality of programmable levels;

Similar or functionally similar elements in the figures have been allocated the same reference signs if not otherwise indicated.

DETAILED DESCRIPTION

Figure 1:
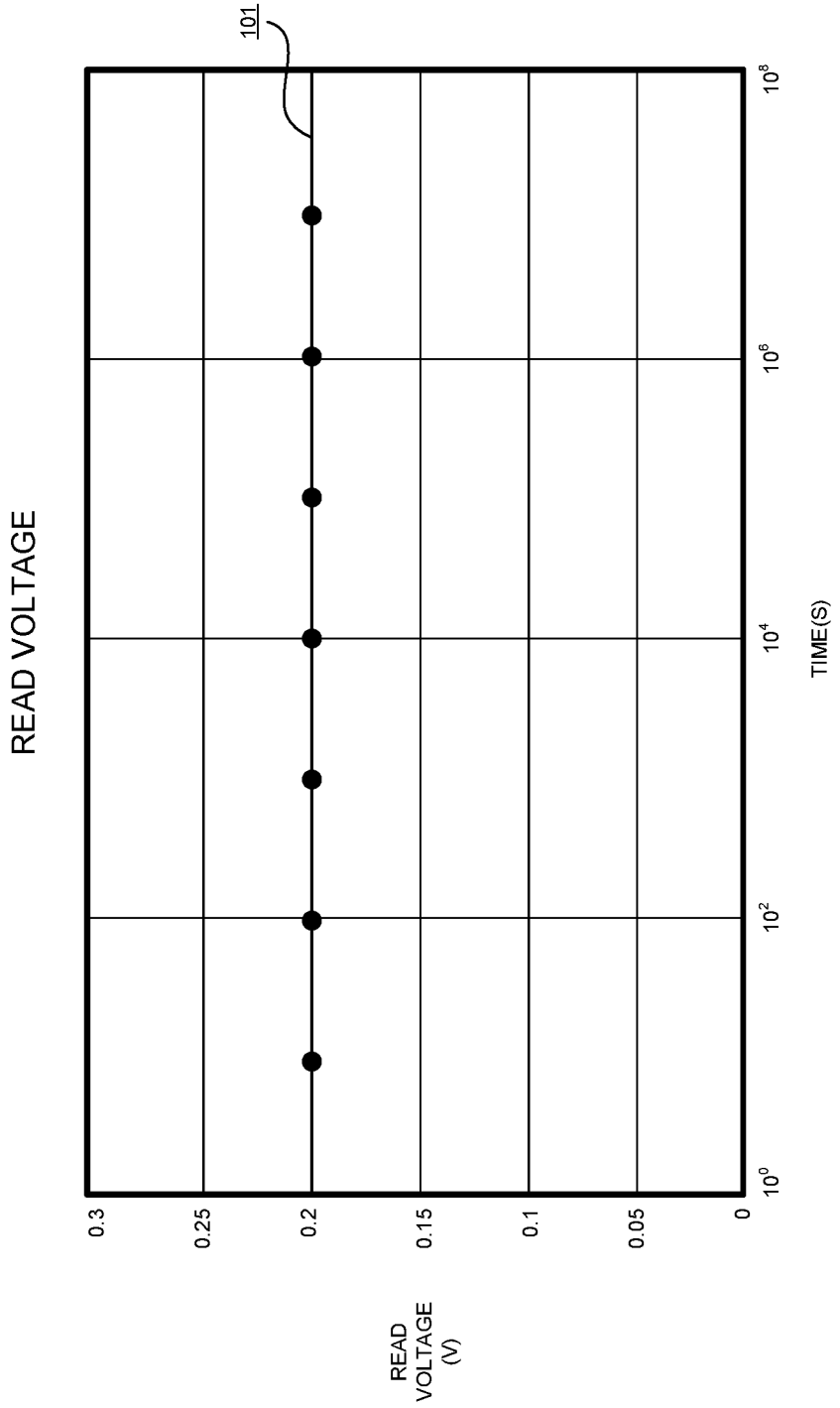
FIGS. 1 to 4 show an example illustrating drift in PCM cell having four levels.
Figure 2:
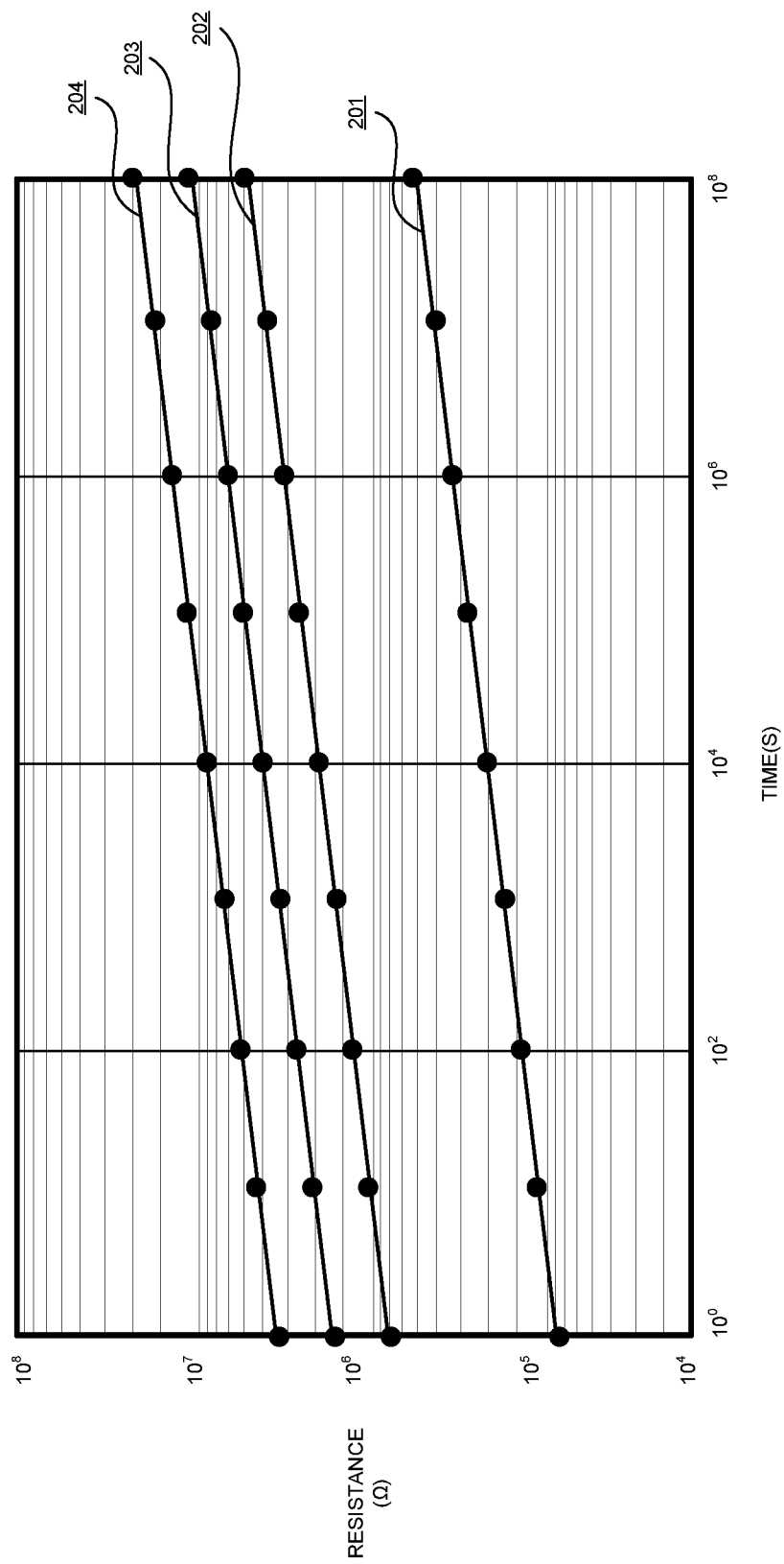
Figure 3:
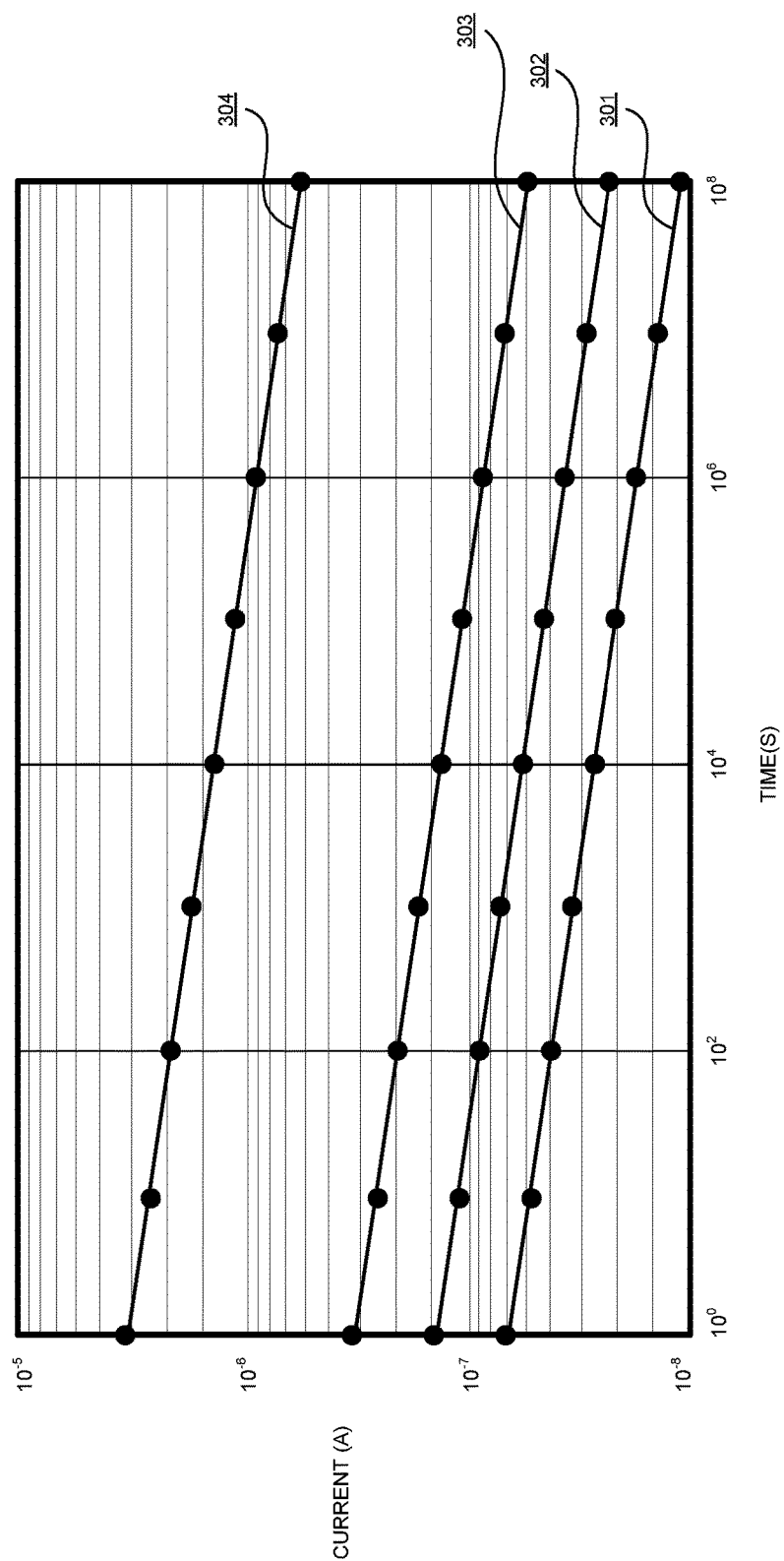
Figure 4:
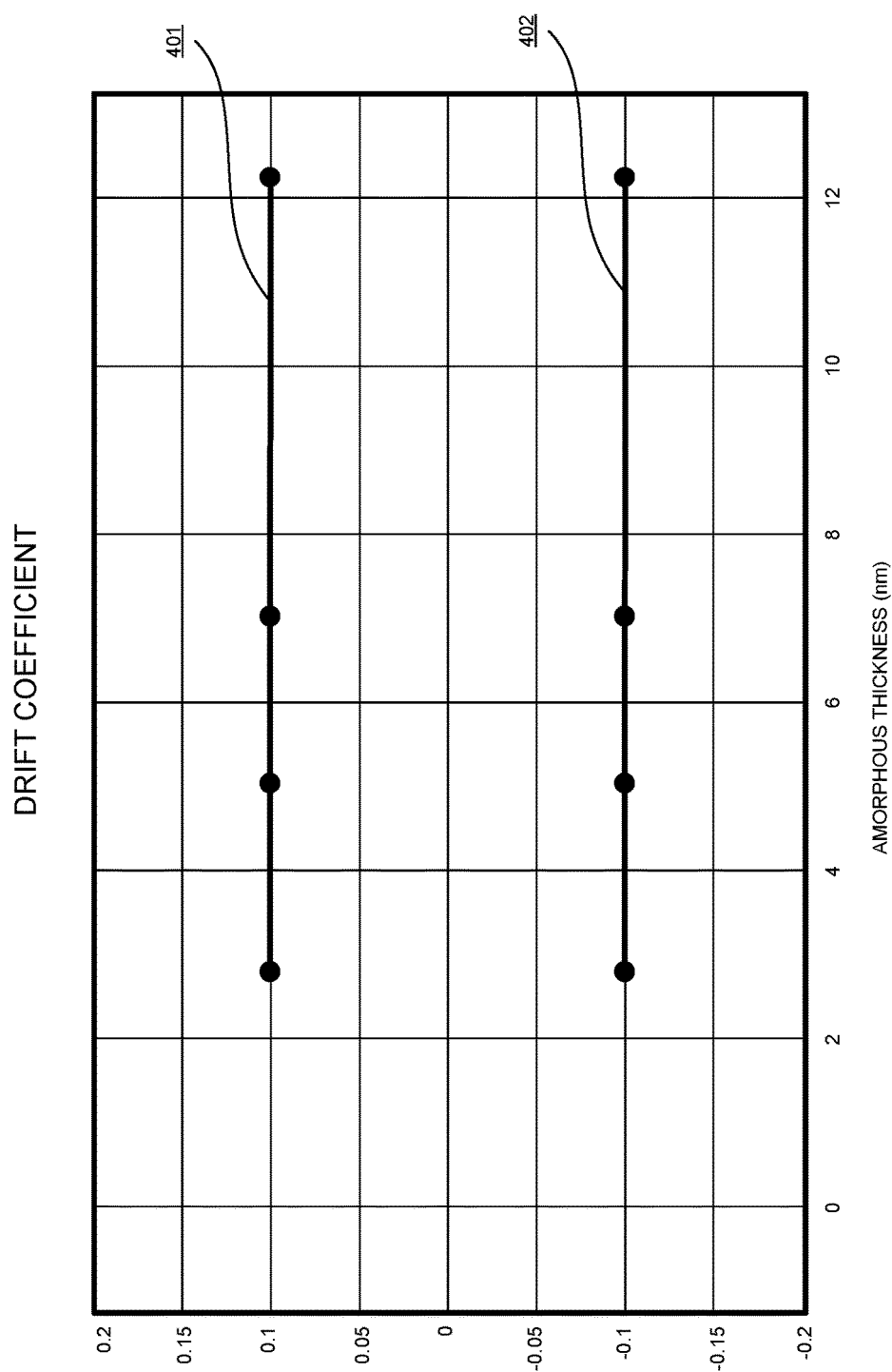
Figure 5:
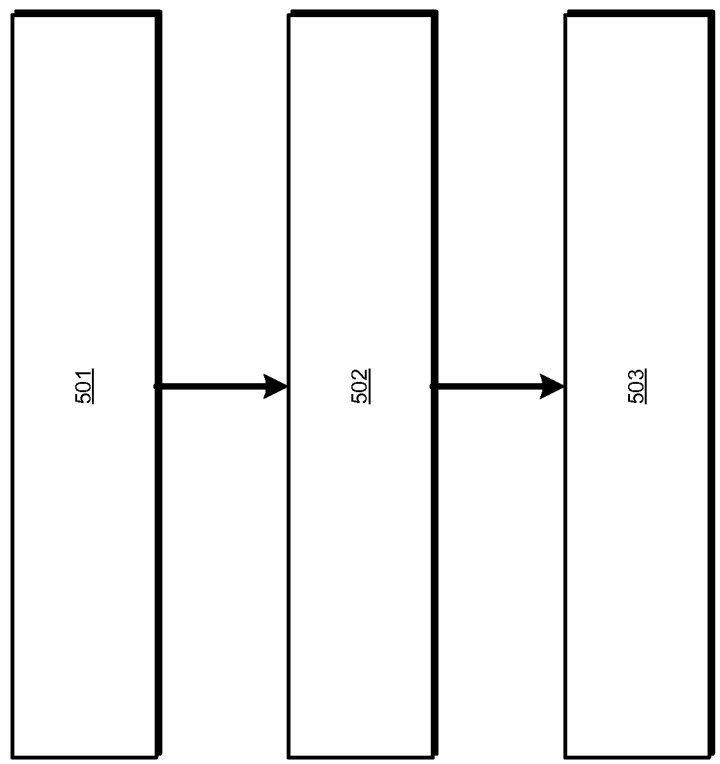
FIG. 5 shows a first embodiment of a sequence of method steps for read measurement of a plurality of resistive memory cells having a plurality of programmable levels.

In FIG. 5, a first embodiment of a sequence of method steps for read measurement of a plurality N of resistive memory cells having a plurality M of programmable levels is depicted. For example, M=4 and the N memory cells are adapted to store 64 kB. The resistive memory cell may be embodied by a PCM cell, for example. The PCM cell is controllable by a first terminal connected to a bitline and by a second terminal connected to a wordline (not shown). Alternatively, a selection device with one terminal controlling the PCM cell may be employed as in the case of a diode (not shown). Some of the memory cells may be used as reference cells and not for storing data—

The method of FIG. 5 includes the following steps 501-503.

In step 501, a number of reference cells are read for obtaining a reading back parameter. The reading back parameter is indicative for the drift of the reference cells over time. The reference cells may be programmed to an intermediate level of the M programmable levels. For the example that M=4, the reference cells are programmed to the second level or to the third level.

In step 502, an actual read voltage for the N memory cells is determined based on the obtained reading back parameter for obtaining a target read current at a following read measurement. In particular, for a plurality of consecutive read measurements, the actual read voltage is determined for a respective one of the plurality of consecutive read measurements such that the target read current is constant over time.

In step 503, at the following read measurement, the determined actual read voltage is applied to the N memory cells for obtaining said read current.

Figure 6:
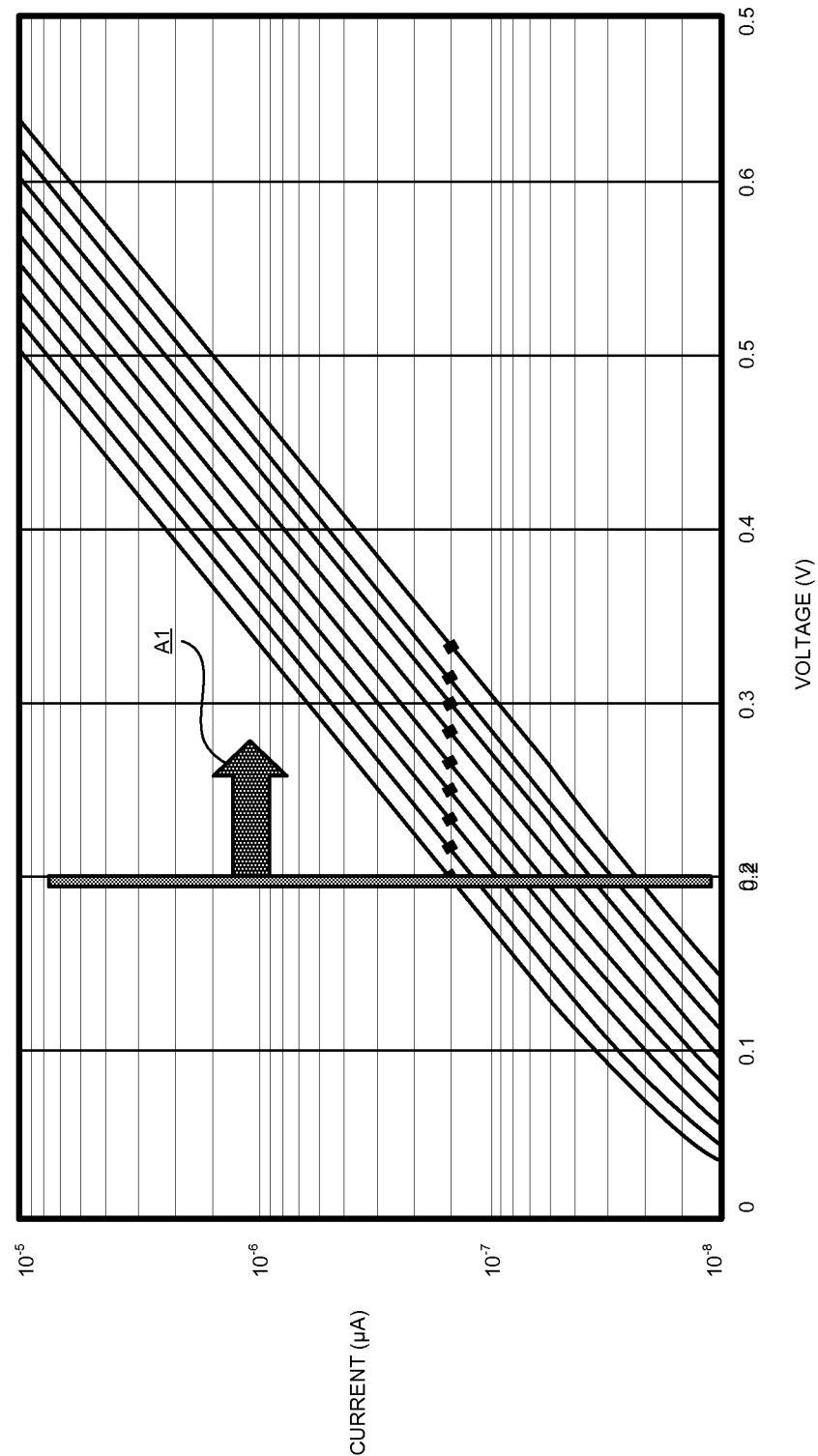
FIG. 6 shows an I-V diagram illustrating read current over read voltage.

In this regard, FIG. 6 shows an I-V diagram illustrating the read current over the read voltage. Due to the non-linear I-V characteristic and the exponential dependence of the read current on the read voltage, small changes in read voltage are adapted to track drift over several orders of magnitude. These small changes are indicated in FIG. 6 by arrow A1. Recapitulating the results of FIG. 6, by changing the read voltage with time, a constant read current can be maintained and drift can be countered.

Figure 7:
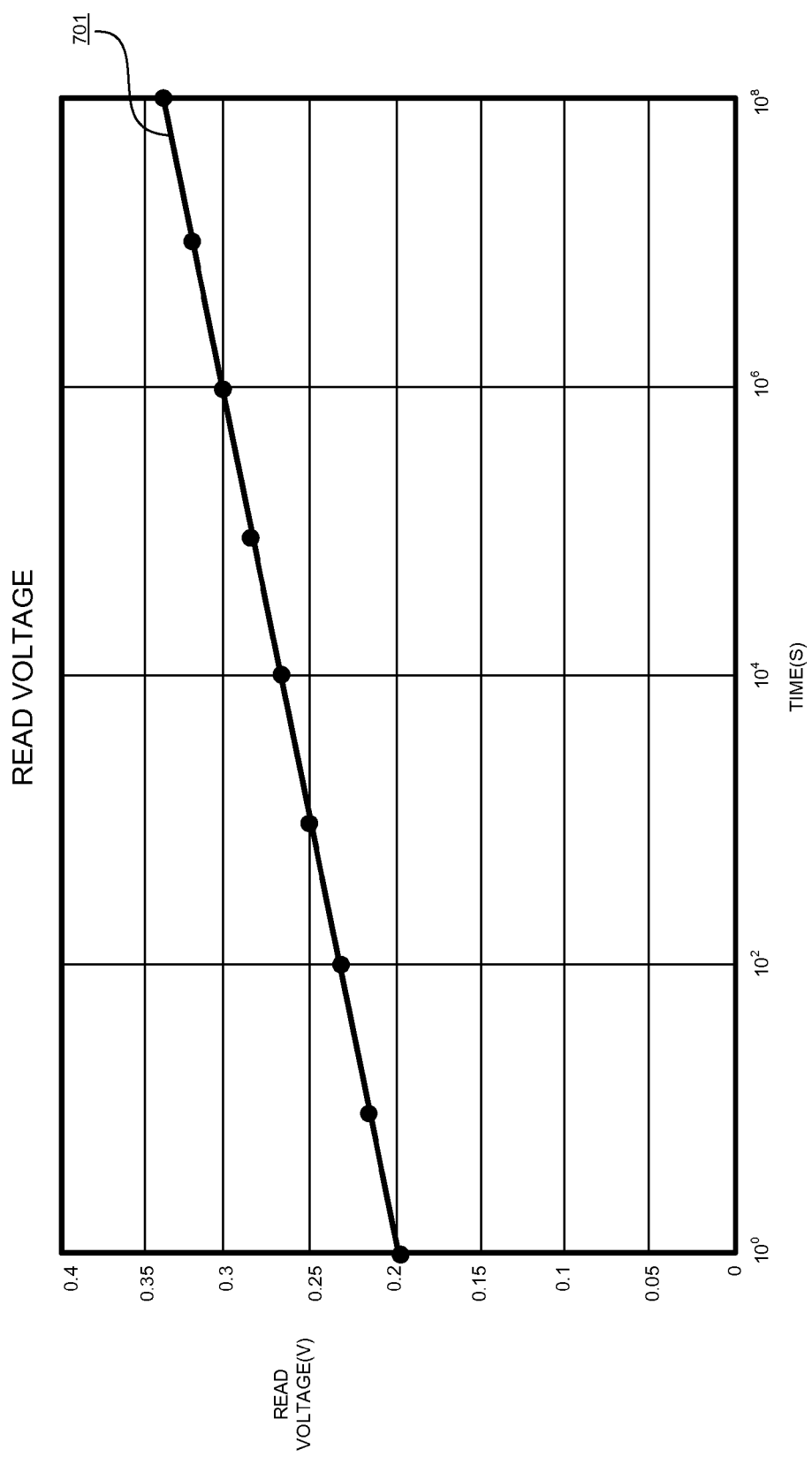
FIGS. 7 to 10 show an example illustrating drift tracking by adjusting the read voltage.
Figure 8:
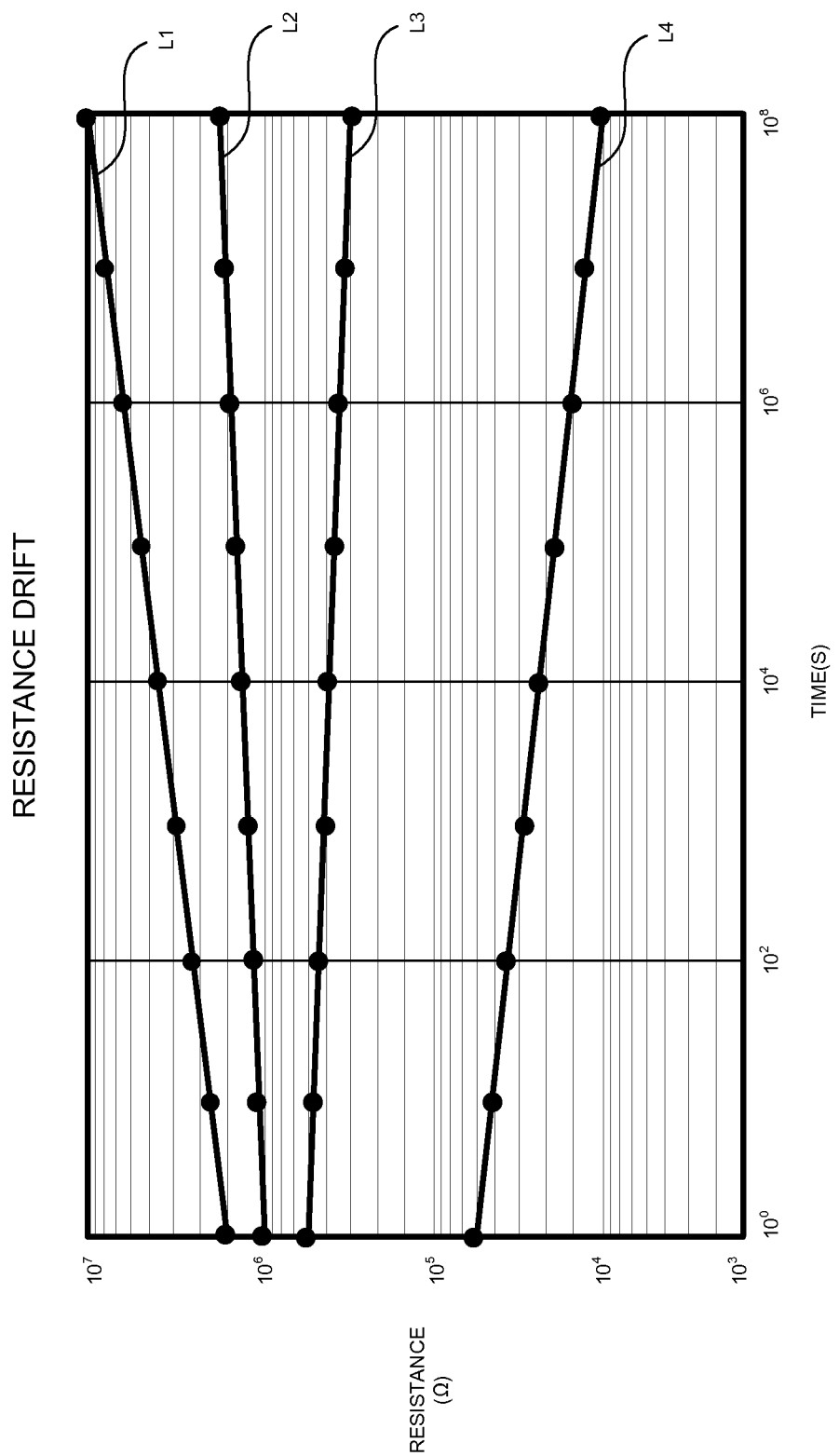
Figure 9:
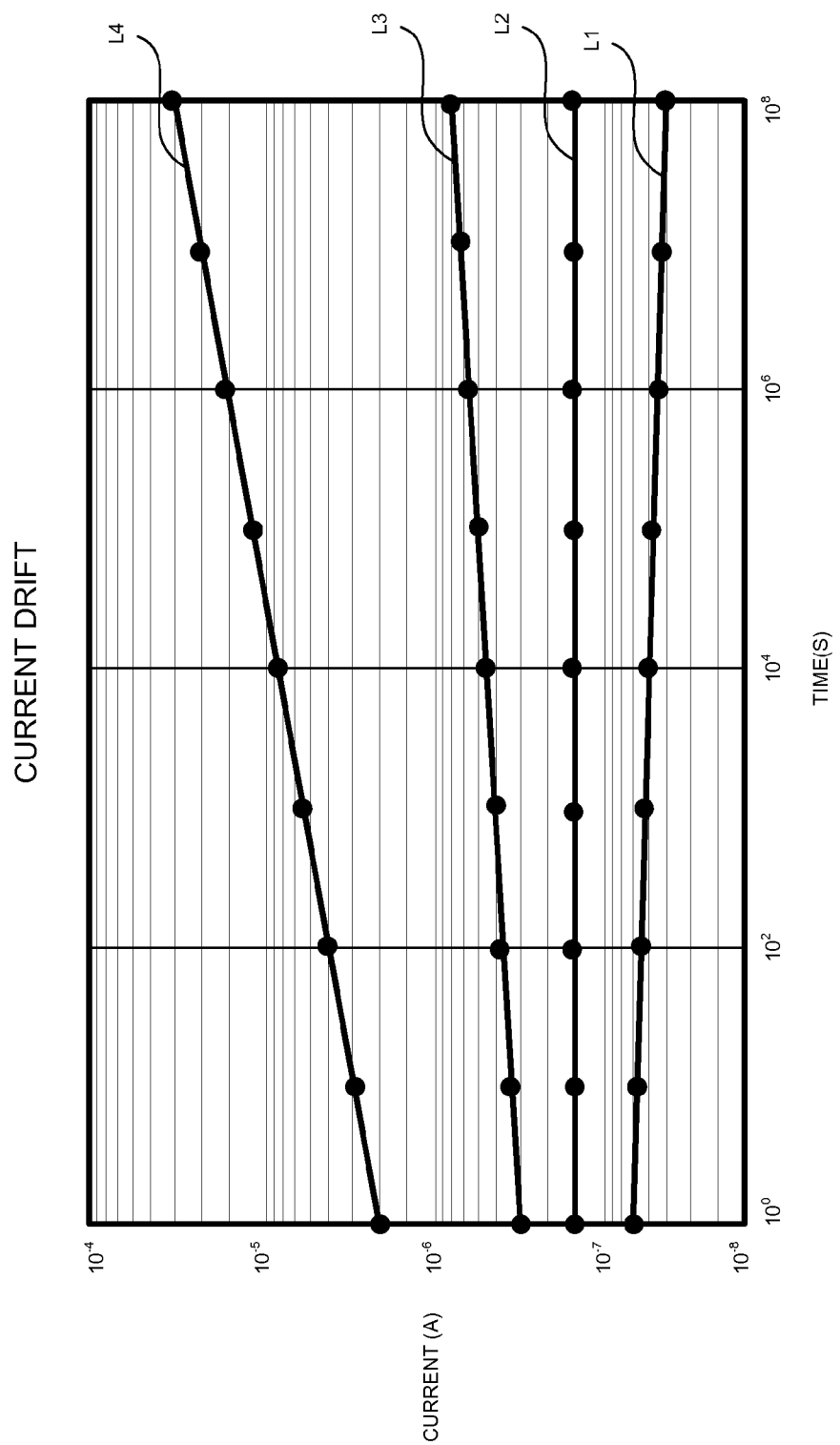
Figure 10:
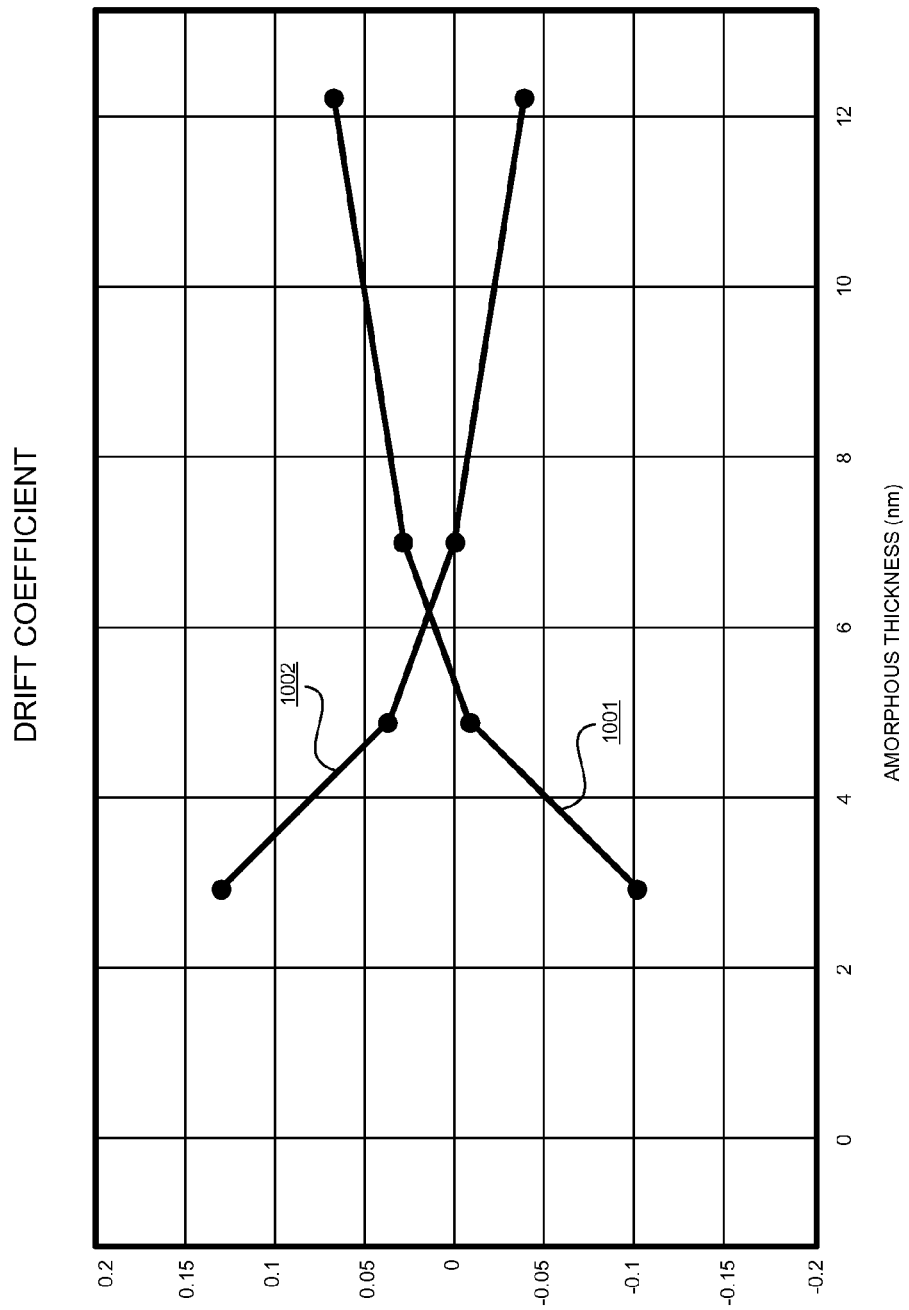

Further, FIGS. 7 to 10 show an example illustrating drift tracking by adjusting the read voltage, for example as described by FIG. 5. Here, FIG. 7 shows the read voltage 701 which is varied over time for an exemplary cell having four levels L1-L4 (M=4). FIG. 8 shows the resulting resistance drift for the four levels L1-L4. Each of the curves 801-804 shows the resistance drift of one of the levels L1-L4. The corresponding current drift for said four levels L1-L4 is shown in FIG. 9. In the example of FIGS. 7 to 10, the actual read voltage is used to cancel drift in level L3. Further, one may recognize that level L4 is overcompensated, wherein level L1 is undercompensated. This has the additional effect that the gaps between the levels L3-L4 and L1-L2 get greater. Further, FIG. 10 shows the drift coefficients for the resistance R (curve 1001) and the current I (curve 1002).

In FIG. 11, a second embodiment of a sequence of method steps for the read measurement of a plurality N of resistive memory cells having a plurality M of programmable levels is shown. The embodiment of FIG. 11 includes the following steps 1101-1104:

In step 1101, a reference read voltage is applied to the number of reference cells. As a result, a reference read current due to the applied reference read voltage is obtained.

In step 1102, a drift-tracking parameter is determined based on the obtained reference read current. The drift-tracking parameter indicates drift, in particular terminal drift, of the reference cells. For example, the drift tracking parameter may be estimated based on the obtained reference read current.

In step 1103, the actual read voltage for the N memory cells is determined based on the reference read voltage and the determined drift-tracking parameter such that the target read current is obtained at the following read measurement or the following read measurements.

In step 1104, at the following read measurement, the determined actual read voltage is applied to the N memory cells. As a result, the target read current is obtained at said following read measurement.

FIG. 12 shows a third embodiment of a sequence of method steps for read measurement of a plurality N of resistive memory cells having a plurality M of programmable levels. The embodiment of FIG. 12 includes the following steps 1201 to 1204.

In step 1201, a certain constant read current is specified for a number of reference cells.

In step 1202, a reference read voltage for the reference cells is determined such that the read current due to the applied reference read voltage corresponds to the certain constant read current.

Figure 13:
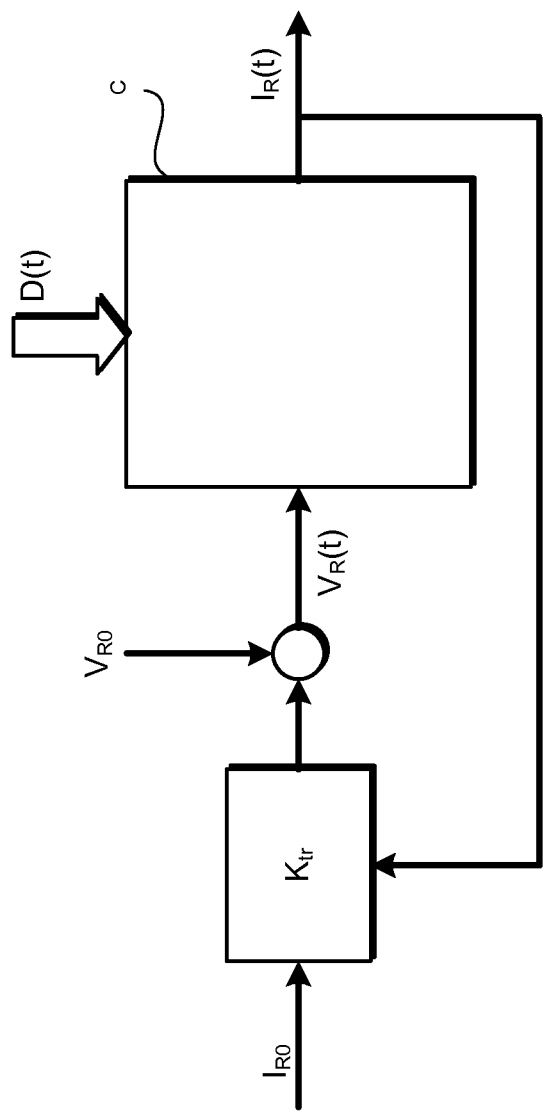
FIG. 13 shows an embodiment of a controller for controlling read measurement of a plurality of resistive memory cells having a plurality of programmable levels.

In step 1203, the actual read voltage for the N memory cells is determined based on the determined reference read voltage for obtaining the target read current at the following read measurement. In particular, the reference read voltage is gradually altered such that the read current due to the applied reference read voltage corresponds to the certain constant read current. The actual read voltage may correspond to the determined reference read voltage. For example, the reference read voltage is obtained by a feedback controller. The feedback controller may be embodied by an integral feedback controller or by a signed-error feedback controller, for example. Here, FIG. 13 shows an example of such a controller designated as $K_p$ in FIG. 13. An exemplary memory cell is referenced by C in FIG. 13. Further, the following references are used in said FIG. 13:

$I_{R0}$: constant read current
$V_{R0}$: constant read voltage
$V_R(t)$: actual read voltage
$D(t)$: drift
$I_R(t)$: actual read current due to the applied actual read voltage The feedback controller may be configured to track the read voltage $I_R(t)$ that results in a zero-current error $e_{IR}(k)$ in the reference cell C, for example.

$$e_{IR}(k) = \log(I_{R0}) - \log(I_R(k))$$

$$V_R(k+1) = V_R(k) + K e_{IR}(k)$$

In step 1204, at the following read measurement, the determined actual read voltage is applied to the N memory cells.

Figure 14:
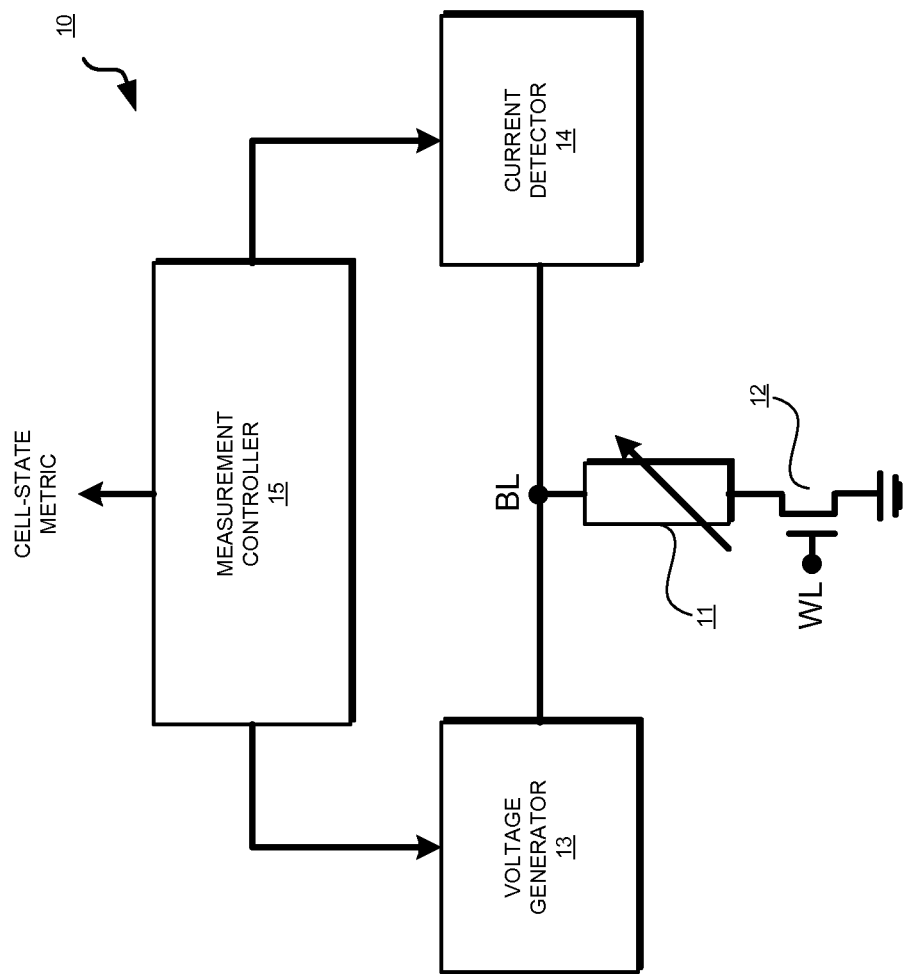
FIG. 14 shows an embodiment of an apparatus for read measurement of a plurality of resistive memory cells having a plurality of programmable levels.

FIG. 14 shows an embodiment of an apparatus 10 for a read measurement of a plurality N of resistive memory cells 11 having a plurality M of programmable levels L1-L4. Without loss of generality and because of illustration, FIG. 14 shows only one memory cell 11. The apparatus 10 of FIG. 14 may be called read measurement apparatus and may be included in a read/write apparatus. The apparatus 10 is connected to the memory cell 11, for example a PCM cell 11. In FIG. 14, the PCM cell 11 is represented as a variable resistance. The cell 11 is assessed via voltages V1, V2 applied to the appropriate wordline WL and bitline BL for the cell 11.

An access device 12, here a field-effect transistor (FET) 12, is connected in series with the cell 11 for controlling the access to the cell 11. The gate of the FET 12 is connected to the wordline WL whereby application of a wordline voltage switches on FET 12, allowing current to flow in cell 11.

The apparatus 10 includes a voltage generator 13 for applying a voltage, here a read voltage V1, V2, to the cell bitline BL. The apparatus 10 also includes a measurement circuit, for example a current detector 14, for making a measurement indicative of current I1, I2 flowing through the cell 11 due to the applied read voltage V1, V2. Further, the apparatus 10 includes a controller 15, a so-called measurement controller 15, for controlling the operation of the apparatus 10. The measurement controller 15 receives the output of the current detector 14 and controls the generation of the voltage generator 13 to implement the following:

The measurement circuit 14 is configured to read back from a number of reference cells to obtain a reading back parameter. The measurement controller 15 is configured to determine an actual read voltage for the N memory cells spaced on the obtained reading back parameter for obtaining a target read current at the following read measurement. At the following read measurement, the voltage generator 13 applies to the determined actual read voltage to the N memory cells.

Computerized devices can be suitably designed for implementing embodiments of the present invention as described herein. In that respect, it can be appreciated that the methods described herein are largely non-interactive and automated. In exemplary embodiments, the methods described herein can be implemented either in an interactive, partly-interactive or non-interactive system. The methods described herein can be implemented in software (e.g., firmware), hardware, or a combination thereof. In exemplary embodiments, the methods described herein are implemented in software, as an executable program, the latter executed by suitable digital processing devices. In further exemplary embodiments, at least one step or all steps of above method of FIG. 5, 11, or 12 may be implemented in software, as an executable program, the latter executed by suitable digital processing devices. More generally, embodiments of the present invention can be implemented wherein general-purpose digital computers, such as personal computers, workstations, etc., are used.

Figure 15:
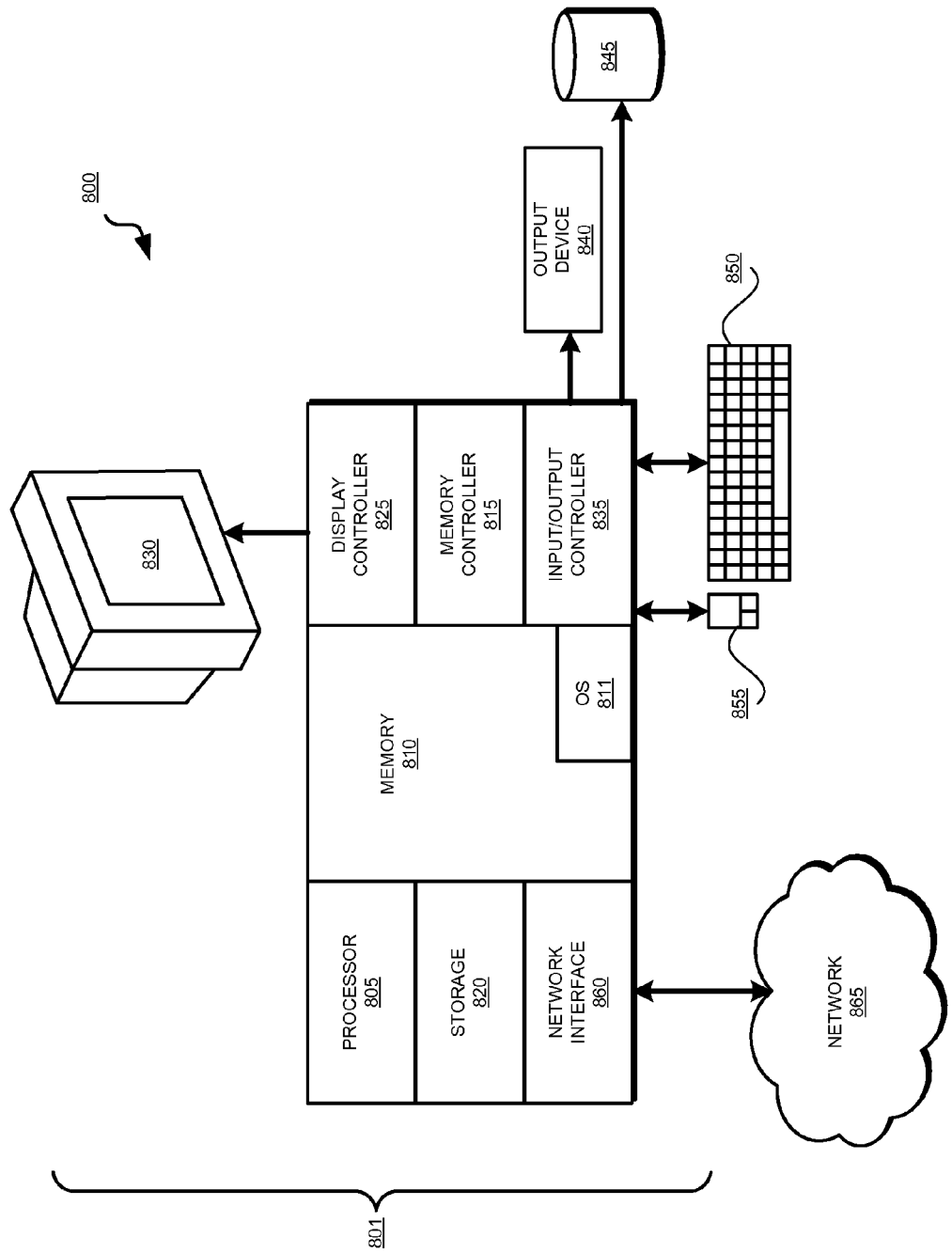
FIG. 15 shows a schematic block diagram of an embodiment of a system adapted for performing the method for read measurement of a plurality of resistive memory.

For instance, the system 800 depicted in FIG. 15 schematically represents a computerized unit 801, e.g., a general-purpose computer. For example, the system 800 may include an apparatus 10 as shown in FIG. 14. In exemplary embodiments, in terms of hardware architecture, as shown in FIG. 15, the unit 801 includes a processor 805, memory 810 coupled to a memory controller 815, and one or more input and/or output (I/O) devices 840, 845, 850, 855 (or peripherals) that are communicatively coupled via a local input/output controller 835. In particular, the memory controller 815 may include said apparatus 10 of FIG. 14. The input/output controller 835 can be, but is not limited to, one or more buses or other wired or wireless connections, as is known in the art. The input/output controller 835 may have additional elements, which are omitted for simplicity, such as controllers, buffers (caches), drivers, repeaters, and receivers, to enable communications. Further, the local interface may include address, control, and/or data connections to enable appropriate communications among the aforementioned components.

The processor 805 is a hardware device for executing software, particularly that stored in memory 810. The processor 805 can be any custom made or commercially available processor, a central processing unit (CPU), an auxiliary processor among several processors associated with the computer 801, a semiconductor based microprocessor (in the form of a microchip or chip set), or generally any device for executing software instructions.

The memory 810 can include any one or combination of volatile memory elements (e.g., random access memory) and nonvolatile memory elements. Moreover, the memory 810 may incorporate electronic, magnetic, optical, and/or other types of storage media. Note that the memory 810 can have a distributed architecture, where various components are situated remote from one another, but can be accessed by the processor 805.

The software in memory 810 may include one or more separate programs, each of which comprises an ordered listing of executable instructions for implementing logical functions. In the example of FIG. 15, the software in the memory 810 includes methods described herein in accordance with exemplary embodiments and a suitable operating system (OS) 811. The OS 811 essentially controls the execution of other computer programs, such as the methods as described herein (e.g., FIG. 5, 11, or 12), and provides scheduling, input-output control, file and data management, memory management, and communication control and related services.

The methods described herein may be in the form of a source program, executable program (object code), script, or any other entity comprising a set of instructions to be performed. When in a source program form, then the program needs to be translated via a compiler, assembler, interpreter, or the like, as known per se, which may or may not be included within the memory 810, so as to operate properly in connection with the OS 811. Furthermore, the methods can be written as an object oriented programming language, which has classes of data and methods, or a procedure programming language, which has routines, subroutines, and/or functions.

Possibly, a conventional keyboard 850 and mouse 855 can be coupled to the input/output controller 835. Other I/O devices 840-855 may include sensors (especially in the case of network elements), i.e., hardware devices that produce a measurable response to a change in a physical condition like temperature or pressure (physical data to be monitored). Typically, the analog signal produced by the sensors is digitized by an analog-to-digital converter and sent to controllers 835 for further processing. Sensor nodes are ideally small, consume low energy, are autonomous and operate unattended.

In addition, the I/O devices 840-855 may further include devices that communicate both inputs and outputs. The system 800 can further include a display controller 825 coupled to a display 830. In exemplary embodiments, the system 800 can further include a network interface or transceiver 860 for coupling to a network 865.

The network 865 transmits and receives data between the unit 801 and external systems. The network 865 is possibly implemented in a wireless fashion, e.g., using wireless protocols and technologies, such as IEEE 802.15.4 or similar. The network 865 may be a fixed wireless network, a wireless local area network (LAN), a wireless wide area network (WAN) a personal area network (PAN), a virtual private network (VPN), intranet or other suitable network system and includes equipment for receiving and transmitting signals.

When the unit 801 is in operation, the processor 805 is configured to execute software stored within the memory 810, to communicate data to and from the memory 810, and to generally control operations of the computer 801 pursuant to the software. The methods described herein and the OS 811, in whole or in part are read by the processor 805, typically buffered within the processor 805, and then executed. When the methods described herein (e.g. with reference to FIG. 5, 11, or 12) are implemented in software, the methods can be stored on any computer readable medium, such as storage 820, for use by or in connection with any computer related system or method.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects. Furthermore, aspects of the present invention may take the form of a computer program product embodied in one or more computer readable medium(s) having computer readable program code embodied thereon. Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device. Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the unit 801, partly thereon, partly on a unit 801 and another unit 801, similar or not.

Aspects of the present invention are described above with reference to flowchart illustrations and/or block diagrams of methods, apparatus (systems) and computer program products according to embodiments of the invention. It will be understood that each block of the flowchart illustrations and/or block diagrams can be implemented by one or more computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved and algorithm optimization. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

More generally, while the present invention has been described with reference to certain embodiments, it will be understood by those skilled in the art that various changes may be made and equivalents may be substituted without departing from the scope of the present invention. In addition, many modifications may be made to adapt a particular situation to the teachings of the present invention without departing from its scope. Therefore, it is intended that the present invention not be limited to the particular embodiments disclosed, but that the present invention will include all embodiments falling within the scope of the appended claims.

The invention claimed is:

1. A method for read measurement of a plurality N of resistive memory cells having a plurality M of programmable levels, wherein N and M are integers greater than 1, the method comprising:
   reading back from a number of reference cells to obtain a reading back parameter,
   determining an actual read voltage for the N memory cells based on the obtained reading back parameter for obtaining a target read current at a following read measurement, and at the following read measurement, applying the determined actual read voltage to the N memory cells, wherein, for a plurality of consecutive read measurements, the actual read voltage is determined for a respective one of the plurality of consecutive read measurements such that the target read current is constant over time.

2. The method of claim 1,
   wherein the reference cells are programmed to an intermediate level of the M programmable levels.

3. The method of claim 1, comprising:
   applying a reference read voltage to the number of reference cells and obtaining a reference read current due to the applied reference read voltage,
   determining a drift tracking parameter based on the obtained reference read current, wherein the drift tracking parameter indicates a drift of the reference cells,
   determining the actual read voltage for the N memory cells based on the reference read voltage and the determined drift tracking parameter for obtaining the target read current at the following read measurement, and
   at the following read measurement, applying the determined actual read voltage to the N memory cells.

4. The method of claim 3,
   wherein the drift tracking parameter is estimated based on the obtained reference read current.

5. The method of claim 3, comprising:
   at a first instance of time, applying the reference read voltage to the reference cells programmed to an intermediate level of the M programmable levels,
   determining the drift tracking parameter based on the obtained reference read current,
   at a second instance of time, determining the actual read voltage for the N memory cells based on the reference read voltage and the determined drift tracking parameter adjusted for the second instance of time, and
   at the second instance of time, applying the determined actual read voltage to the N memory cells.

6. The method of claim 1, comprising
   specifying a constant read current for the number of reference cells,
   determining a reference read voltage for the number of reference cells such that the read current due to the applied reference read voltage corresponds to the constant read current,
   determining the actual read voltage for the N memory cells based on the determined reference read voltage for obtaining the target read current at the following read measurement, and
   at the following read measurement, applying the determined actual read voltage to the N cells.

7. The method of claim 6,
   wherein the reference read voltage is modified such that the read current due to the applied reference read voltage corresponds to the constant read current.

8. The method of claim 7,
   wherein the actual read voltage corresponds to the determined reference read voltage.

9. The method of claim 7,
   wherein the reference read voltage is modified by a feedback controller.

10. The method of claim 9,
    wherein the feedback controller is adapted to modify the reference read voltage such that a current error between the read current due to the applied reference read voltage and the constant read current is minimized.

11. The method of claim 6,
    wherein the constant read current corresponds to the target read current.

12. An apparatus for read measurement of a plurality N of resistive memory cells having a plurality M of programmable levels, wherein N and M are integers greater than 1, the apparatus comprising:
    a measurement circuit for reading back from a number of reference cells to obtain a reading back parameter,
    a controller for determining an actual read voltage for the N memory cells based on the obtained reading back parameter for obtaining a target read current at a following read measurement, and
    a voltage generator which is configured to apply the determined actual read voltage to the N memory cells at the following read measurement, wherein, for a plurality of consecutive read measurements, the actual read voltage is determined for a respective one of the plurality of consecutive read measurements such that the target read current is constant over time.

13. A resistive memory device comprising:
    a memory including a plurality N of resistive memory cells having a plurality M of programmable levels, wherein N and M are integers greater than 1, and
    a read/write apparatus for reading and writing data in the resistive memory cells, wherein the read/write apparatus includes an apparatus for read measurement of the plurality N of resistive memory cells having the plurality M of programmable levels, the apparatus for read measurement comprising:
    a measurement circuit for reading back from a number of reference cells to obtain a reading back parameter,
    a controller for determining an actual read voltage for the N memory cells based on the obtained reading back parameter for obtaining a target read current at a following read measurement, and a voltage generator which is configured to apply the determined actual read voltage to the N memory cells at the following read measurement, wherein, for a plurality of consecutive read measurements, the actual read voltage is determined for a respective one of the plurality of consecutive read measurements such that the target read current is constant over time.

* * * * *